US011378854B2

(12) United States Patent
Wu et al.

(10) Patent No.: US 11,378,854 B2
(45) Date of Patent: Jul. 5, 2022

(54) SUB-PIXEL STRUCTURE, LIQUID CRYSTAL PANEL, AND REFLECTIVE LIQUID CRYSTAL DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Xiaojuan Wu, Beijing (CN); Xuan Zhong, Beijing (CN); Hongliang Yuan, Beijing (CN); Qi Zheng, Beijing (CN); Zhangxiang Cheng, Beijing (CN); Yao Bi, Beijing (CN); Zhiqiang Zhao, Beijing (CN); Jiaxing Wang, Beijing (CN); Donghua Zhang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 16/838,616

(22) Filed: Apr. 2, 2020

(65) Prior Publication Data

US 2021/0157193 A1 May 27, 2021

(30) Foreign Application Priority Data

Nov. 21, 2019 (CN) .......................... 201911151427.0

(51) Int. Cl.
  *G02F 1/1368* (2006.01)
  *G02F 1/1362* (2006.01)
(52) U.S. Cl.
  CPC ........ *G02F 1/13624* (2013.01); *G02F 1/1368* (2013.01); *G02F 1/136286* (2013.01)

(58) Field of Classification Search
  CPC ........... G02F 1/13624; G02F 1/136286; G02F 1/1368
  See application file for complete search history.

(56) References Cited

U.S. PATENT DOCUMENTS 10,139,689 B2 11/2018 Wang
2006/0022202 A1* 2/2006 Yu .................... G02F 1/13624
257/72

(Continued)

FOREIGN PATENT DOCUMENTS

CN 103278990 A 9/2013
CN 104635396 A 5/2015

(Continued)

OTHER PUBLICATIONS

Chinese Office Action in Chinese Application No. 201911151427.0 dated Oct. 28, 2021 with English translation.

*Primary Examiner* — James A Dudek
(74) *Attorney, Agent, or Firm* — Collard & Roe, P.C.

(57) ABSTRACT

The present disclosure provides a sub-pixel structure, a liquid crystal panel and a reflective liquid crystal display device. The sub-pixel structure includes a pixel electrode, and a first thin film transistor and a second thin film transistor integrated on an array substrate; the first thin film transistor and the second thin film transistor are respectively close to a first side and a second side, opposite to each other, of the pixel electrode, and are adjacent to and are connected to two scanning lines in the array substrate, respectively; and a length of a channel region of the first thin film transistor is greater than a first length threshold, and a length of a channel region of the second thin film transistor is greater than a second length threshold.

18 Claims, 3 Drawing Sheets

(56) References Cited

U.S. PATENT DOCUMENTS

| | | | |
|---|---|---|---|
| 2006/0119756 A1* | 6/2006 | Shin | G02F 1/13624 |
| | | | 349/38 |
| 2007/0097052 A1* | 5/2007 | Sasaki | G09G 3/3648 |
| | | | 345/92 |
| 2012/0224128 A1* | 9/2012 | Jung | G02F 1/1395 |
| | | | 349/129 |
| 2013/0082914 A1 | 4/2013 | Matsumura et al. | |

FOREIGN PATENT DOCUMENTS

| | | |
|---|---|---|
| CN | 106252363 A | 12/2016 |
| CN | 106526996 A | 3/2017 |
| CN | 106896610 A | 6/2017 |

* cited by examiner

SUB-PIXEL STRUCTURE, LIQUID CRYSTAL PANEL, AND REFLECTIVE LIQUID CRYSTAL DISPLAY DEVICE

The present application claims priority to Chinese patent application No. 201911151427.0, filed on Nov. 21, 2019, the entire disclosure of which is incorporated herein by reference as part of the present application.

TECHNICAL FIELD

The present disclosure relates to a sub-pixel structure, a liquid crystal panel, and a reflective liquid crystal display device.

BACKGROUND

With the rapid development of the display industry, liquid crystal display screens have been widely used in people's lives, such as mobile phones, computers, televisions, watches, and so on. With the rapid development of mobile phone functions and smart wearable products, people are increasingly demanding outdoor readability of displays. At present, total reflection liquid crystal display devices are more and more widely used because of their advantages such as low power consumption, display of color images, and high resolution.

SUMMARY

The present disclosure provides a sub-pixel structure, a liquid crystal panel, and a reflective liquid crystal display device.

At least one embodiment of the present disclosure provides a sub-pixel structure including a pixel electrode, and a first thin film transistor and a second thin film transistor integrated on an array substrate. The first thin film transistor and the second thin film transistor are respectively close to a first side and a second side, opposite to each other, of the pixel electrode, and are adjacent to and are connected to two scanning lines in the array substrate, respectively; and a length of a channel region of the first thin film transistor is greater than a first length threshold, and a length of a channel region of the second thin film transistor is greater than a second length threshold.

For example, in an embodiment of the present disclosure, a length direction of the channel region of the first thin film transistor is substantially perpendicular to the two scanning lines, a length direction of the channel region of the second thin film transistor is substantially parallel to the two scanning lines, and each of the two scanning lines is parallel to each other; a drain electrode of the first thin film transistor is connected to a source electrode of the second thin film transistor, a source electrode of the first thin film transistor is connected to a corresponding data line, a gate electrode of the first thin film transistor is connected to one of the two scanning lines which is adjacent to the first thin film transistor, and the data line is perpendicular to the scanning line adjacent to the first thin film transistor; and a drain electrode of the second thin film transistor is connected to the pixel electrode, and a gate electrode of the second thin film transistor is connected to one of the two scanning lines which is adjacent to the second thin film transistor.

For example, in an embodiment of the present disclosure, the first thin film transistor is close to a third side of the pixel electrode in a direction parallel to the two scanning lines and is adjacent to the data line; and the source electrode of the second thin film transistor is closer to the third side of the pixel electrode than the drain electrode of the second thin film transistor.

For example, in an embodiment of the present disclosure, the source electrode of the first thin film transistor, the drain electrode of the first thin film transistor, the source electrode of the second thin film transistor, and the drain electrode of the second thin film transistor are located on the same layer as the data line; the gate electrode of the first thin film transistor and the gate electrode of the second thin film transistor are located on the same layer as the two scanning lines; the sub-pixel structure comprises a first conductive strip, a second conductive strip, and a conductive block; one end of the first conductive strip is used as the source electrode of the first thin film transistor, and the other end of the first conductive strip is connected to the data line; one end of the second conductive strip is used as the drain electrode of the first thin film transistor, and the other end of the second conductive strip is used as the source electrode of the second thin film transistor; and the conductive block is located between the two scanning lines which are adjacent to each other, a part of the conductive block is used as the drain electrode of the second thin film transistor, and the other part of the conductive block is connected to the pixel electrode.

For example, in an embodiment of the present disclosure, the gate electrode of the first thin film transistor has a strip shape and extends in a direction perpendicular to the two scanning lines; one end of the gate electrode of the first thin film transistor is configured to form an integrated structure with the scanning line adjacent to the first thin film transistor, and overlaps with the end, used as the source electrode of the first thin film transistor, of the first conductive strip; and the other end of the gate electrode of the first thin film transistor overlaps with the end, used as the drain electrode of the first thin film transistor, of the second conductive strip.

For example, in an embodiment of the present disclosure, the gate electrode of the second thin film transistor has a strip shape and extends in the direction parallel to the two scanning lines, and is configured to form an integrated structure with the scanning line adjacent to the second thin film transistor; and one end of the gate electrode of the second thin film transistor overlaps with the end, used as the source electrode of the second thin film transistor, of the second conductive strip, and the other end of the gate electrode of the second thin film transistor overlaps with the conductive block.

At least one embodiment of the present disclosure provides a liquid crystal panel including an array substrate, a plurality of rows of scanning lines parallel to each other, a plurality of columns of data lines parallel to each other, and a plurality of sub-pixel structures each of which is the sub-pixel structure described above. The scanning lines, the data lines, and the first thin film transistors and the second thin film transistors of the sub-pixel structures are all integrated on the array substrate; the data lines are perpendicular to the scanning lines; the first thin film transistor and the second thin film transistor of each of the sub-pixel structures are adjacent to and connected to the two scanning lines of the scanning lines, respectively; and the first thin film transistor of each of the sub-pixel structures is further connected to one of the data lines.

For example, in an embodiment of the present disclosure, a source electrode of the first thin film transistor in each sub-pixel structure is connected to a corresponding data line, and a gate electrode of the first thin film transistor in each sub-pixel structure is connected to one scanning line of the two scanning lines which is adjacent to the first thin film transistor; and a drain electrode of the second thin film transistor in each sub-pixel structure ais connected to the pixel electrode of the sub-pixel structure, and a gate electrode of the second thin film transistor in each sub-pixel structure is connected to one scanning line of the two scanning lines which is adjacent to the second thin film transistor.

For example, in an embodiment of the present disclosure, one end of the gate electrode of the first thin film transistor and the scanning line adjacent to the first thin film transistor are in an integrated structure, and the gate electrode of the second thin film transistor and the scanning line adjacent to the second thin film transistor are in an integrated structure.

At least one embodiment of the present disclosure provides a reflective liquid crystal display device including the liquid crystal panel described above.

At least one embodiment of the present disclosure provides a sub-pixel structure including a pixel electrode, a first thin film transistor, and a second thin film transistor, and the first thin film transistor and the second thin film transistor both overlap with the pixel electrode. A gate electrode of the first thin film transistor and a gate electrode of the second thin film transistor are respectively close to a first side and a second side, opposite to each other, of the pixel electrode, the gate electrode of the first thin film transistor is connected to a first scanning line, and the gate electrode of the second thin film transistor is connected to a second scanning line.

For example, in an embodiment of the present disclosure, a length of a channel region of the first thin film transistor is greater than a first length threshold, a length of a channel region of the second thin film transistor is greater than a second length threshold, the first length threshold is 5% of a size of the pixel electrode in a length direction of the channel region of the first thin film transistor, and the second length threshold is 5% of a size of the pixel electrode in a length direction of the channel region of the second thin film transistor.

For example, in an embodiment of the present disclosure, the length direction of the channel region of the first thin film transistor is a first direction, and the length direction of the channel region of the second thin film transistor is a second direction; a drain electrode of the first thin film transistor is connected to a source electrode of the second thin film transistor, a source electrode of the first thin film transistor is connected to a data line, and a drain electrode of the second thin film transistor is connected to the pixel electrode; and the data line is configured to extend in the first direction, the first scanning line and the second scanning line are configured to extend in the second direction, and the first direction is perpendicular to the second direction.

For example, in an embodiment of the present disclosure, the source electrode of the first thin film transistor, the gate electrode of the first thin film transistor, the drain electrode of the first thin film transistor, and the source electrode of the second thin film transistor, and the gate electrode of the second thin film transistor are arranged in an L-shape.

For example, in an embodiment of the present disclosure, the gate electrode of the first thin film transistor and the drain electrode of the second thin film transistor are located on a same side of the gate electrode of the second thin film transistor.

For example, in an embodiment of the present disclosure, the source electrode of the second thin film transistor and the drain electrode of the second thin film transistor are located on a same side of the gate electrode of the second thin film transistor.

For example, in an embodiment of the present disclosure, the gate electrode of the second thin film transistor and the drain electrode of the second thin film transistor are located on a same side of a center line, extending in the first direction, of the gate electrode of the first thin film transistor.

For example, in an embodiment of the present disclosure, the source electrode of the first thin film transistor and the gate electrode of the second thin film transistor are located on two sides of a center line, extending in the second direction, of the drain electrode of the second thin film transistor.

At least one embodiment of the present disclosure provides a liquid crystal panel including an array substrate, and the array substrate comprises a first scanning line and a second scanning line parallel to each other, a data line, and the sub-pixel structure described above. The data line extends in a first direction, the first scanning line and the second scanning line extend in a second direction, and the first direction is perpendicular to the second direction; the first thin film transistor and the second thin film transistor of the sub-pixel structure are adjacent to and connected to the first scanning line and the second scanning line, respectively; the first thin film transistor is connected to the data line; and the data line, the first scanning line, and the second scanning line all overlap with the pixel electrode, and the first scanning line and the second scanning line are respectively close to the first side and the second side, opposite to each other, of the pixel electrode.

For example, in an embodiment of the present disclosure, the first thin film transistor is close to a third side of the pixel electrode in the second direction, the data line is located at a side of the first thin film transistor and the second thin film transistor close to the third side of the pixel electrode, and in the second direction, the gate electrode of the first thin film transistor and a drain electrode of the first thin film transistor are between a drain electrode of the second thin film transistor and the data line.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all of the technical terms and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

The power consumption of a liquid crystal display device is directly proportional to the display frequency of the liquid crystal display device. For a reflective liquid crystal display device, in order to reduce the power consumption, it is generally necessary to reduce the display driving frequency, for example, a lower display frequency such as 1 Hz (hertz) is used, however, the reduction of the display frequency requires increasing the holding time of the pixel voltage. Because of the leakage current, the pixel voltage decreases with time, which causes the display screen to flicker easily and affect the display effect.

Figure 1:
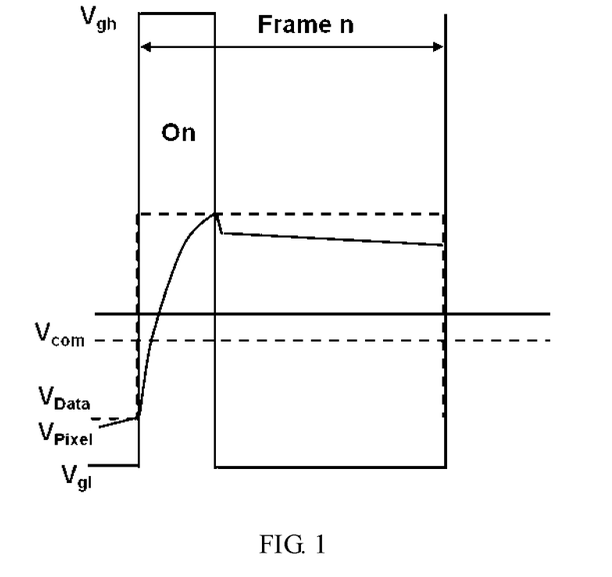
FIG. 1 is a schematic waveform diagram of a pixel voltage of a display device having a thin film transistor.

FIG. 1 is a schematic waveform diagram of a pixel voltage of a display device having a thin film transistor. As illustrated in FIG. 1, during a charging phase, a scanning signal is input to a scanning line to control a thin film transistor (TFT) connected to the scanning line to be turned on, so that a data line can input a voltage signal to a pixel electrode of a display device through the thin film transistor to make the pixel voltage reaches a certain value. After the charging phase is completed, the pixel voltage is continuously reduced because of the leakage current during a pixel voltage holding phase.

Figure 2:
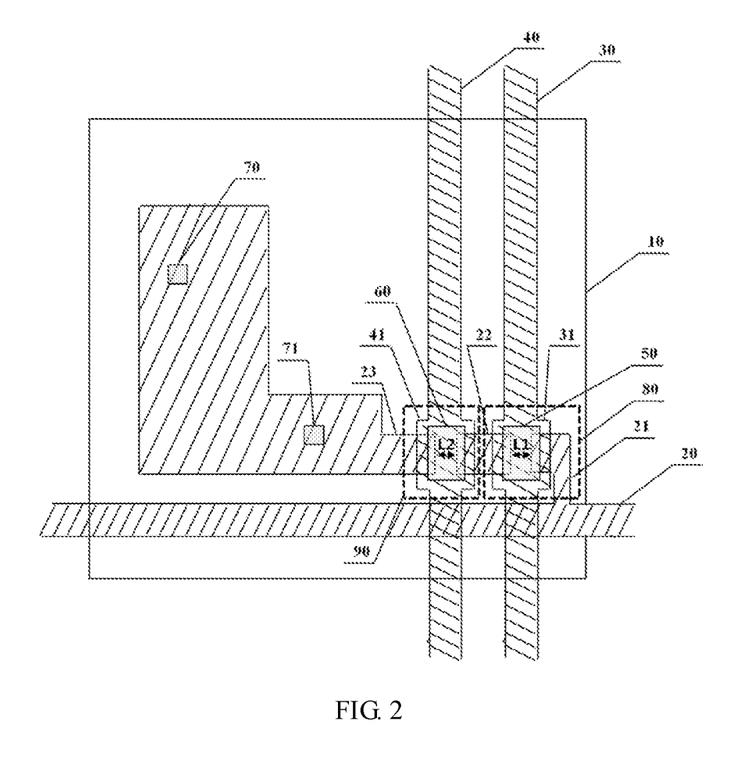
FIG. 2 is a schematic diagram of a pixel structure of a low-power reflective liquid crystal display device.

FIG. 2 is a schematic diagram a pixel structure of a low-power reflective liquid crystal display device. As illustrated in FIG. 2, the array substrate includes a pixel structure, and the array substrate includes a base substrate, sub-pixels on the base substrate, a data line 20 extending in a first direction, and a first scanning line 30 and a second scanning line 40 extending in a second direction. Each sub-pixel in the array substrate includes a pixel electrode 10. The first scanning line 30 and the second scanning line 40 are between the data line 20 and the base substrate, and the pixel electrode 10 is located on a side of the data line 20 away from the base substrate.

Each sub-pixel in the array substrate further includes a first thin film transistor 80 and a second thin film transistor 90. The first thin film transistor 80 includes a first active region 50, a first gate electrode 31 overlapping the first active region 50, a first source electrode 21 connected to the data line 20 and a first drain electrode 22 connected to the second thin film transistor 80. The second thin film transistor 90 includes a second active region 60, a second gate electrode 41 overlapping the second active region 60, a second source electrode 22 that is integrated with the first drain electrode 22, and a second drain electrode 23 connected to the pixel electrode 10. The pixel electrode 10 is connected to the second drain electrode 23 through vias 70 and 71. The pixel electrode 10 is located on a side of the second drain electrode 23 away from the base substrate, and in a direction perpendicular to the base substrate, the first thin film transistor 80, the second thin film transistor 90, the data line 20, the first scanning line 30, and the second scanning line 40 all overlap with the pixel electrode 10, and orthographic projections of the first thin film transistor 80 and the second thin film transistor 90 on the base substrate completely fall into an orthographic projection of the pixel electrode 10 on the base substrate.

By providing two thin film transistors in each sub-pixel in the above array substrate, the characteristics of the thin film transistors can be ensured while reducing the power consumption. Each sub-pixel in the array substrate adopts a dual-gate design, and the pixels are charged upon the two thin film transistors being turned on at the same time. After the charging phase is completed, the two thin film transistors simulate high-frequency driving and are turned on alternately during the pixel voltage holding phase, thereby guaranteeing the characteristics of the thin film transistors and preventing the polarization of liquid crystal.

In the study, the present inventors of the present application have found that the above mentioned display device still adopts a conventional design thinking, and the two thin film transistors are centrally arranged in a corner region of the sub-pixel. Because of the limited layout space of the thin film transistors in the sub-pixel, the two thin film transistors may only be designed to be relatively compact, resulting in a shorter channel length and lower resistance of the thin film transistors, which lead to a problem that the above-mentioned liquid crystal display device has a large leakage current upon the display frequency being small, and easily affects the display effect.

The following describes the sub-pixel structure, the liquid crystal panel, and the reflective liquid crystal display device provided by embodiments of the present disclosure with reference to the drawings.

Figure 3:
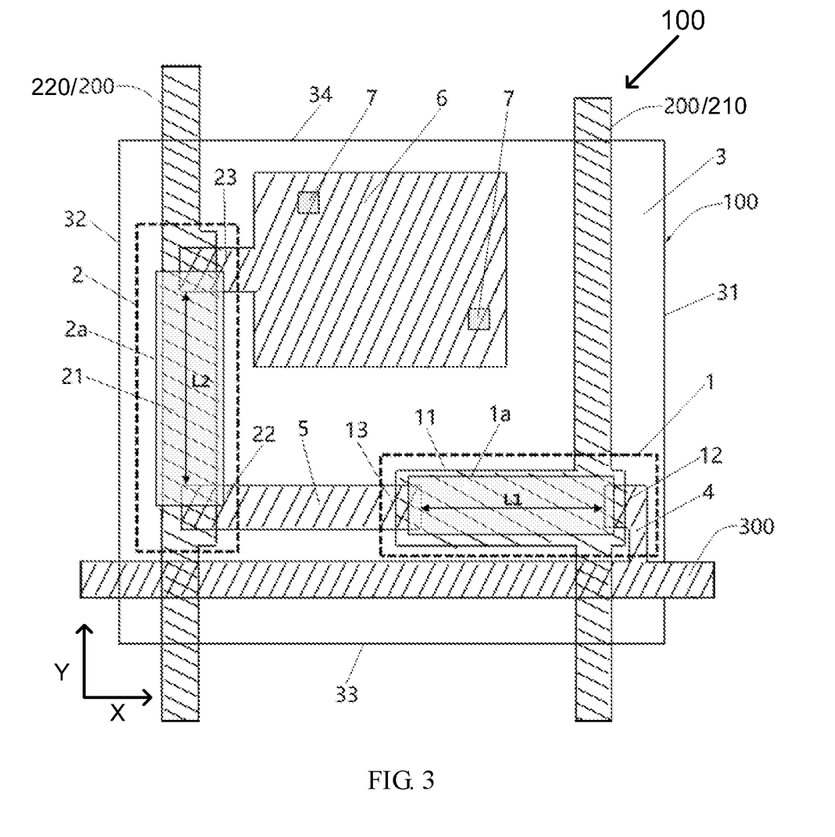
FIG. 3 is a schematic diagram of a position relationship between a sub-pixel structure and scanning lines and a data line according to an embodiment of the present disclosure.

An embodiment of the present disclosure provides a sub-pixel structure 100, as illustrated in FIG. 3, the sub-pixel structure 100 includes a pixel electrode 3, a first thin film transistor 1, and a second thin film transistor 2. A gate electrode 11 of the first thin film transistor 1 and a gate electrode 21 of the second thin film transistor 2 are respectively close to a first side and a second side, opposite to each other, of the pixel electrode 3, and are adjacent to and are connected to a first scanning line 210 and a second scanning line 220 of two scanning lines 200, respectively. The first scanning line 210 and the second scanning line 220 are parallel to each other. A length L1 of a channel region 1a of the first thin film transistor 1 is greater than a first length threshold, and a length L2 of a channel region 2a of the second thin film transistor 2 is greater than a second length threshold.

FIG. 3 illustrates a part of the sub-pixel structure, and schematically illustrates a connection relationship between the first thin film transistor 1 and the second thin film transistor 2, the approximate positions and placement manner of the first thin film transistor 1 and the second thin film transistor 2 in the sub-pixel structure, and the positional relationship among the sub-pixel structure, the scanning line 200 and data line 300. Based on the sub-pixel structure 100 illustrated in FIG. 3, those skilled in the art can know the arrangement manner of components not illustrated in FIG. 3 (such as a liquid crystal layer, a common electrode, a polarizing plate, and the like), so the present disclosure does not specifically introduce the components not illustrated in FIG. 3.

In a case where an electric field is applied to a thin film transistor, a specified region in the thin film transistor forms a conductive channel between the source electrode and the drain electrode of the thin film transistor. The channel region in the embodiment of the present disclosure refers to a region in which a channel can be formed in the thin film transistor. The first side and the second side of the pixel electrode 3 opposite to each other refer to two opposite sides of the pixel electrode 3 in a first direction (for example, the X direction).

In the embodiments of the present disclosure, the first length threshold and the second length threshold should satisfy: in the case where the length of the channel region of the first thin film transistor 1 is larger than the first length threshold, and the length of the channel region of the second thin film transistor 2 is larger than the second length threshold, a leakage current problem of the liquid crystal display device including the sub-pixel structure 100 can be significantly eliminated. The specific values of the first length threshold and the second length threshold may be determined according to actual design requirements.

In the sub-pixel structure 100 provided by the present disclosure, because the first thin film transistor 1 and the second thin film transistor 2 are respectively located close to the first side and the second side of the pixel electrode 3 opposite to each other, a separation between the two thin film transistors is increased, so that each thin film transistor has a larger layout space. The length of the channel region of the first thin film transistor 1 may be appropriately extended to exceed the first length threshold; and the length of the channel region of the second thin film transistor 2 may be appropriately extended to exceed the second length threshold. After the sub-pixel structure 100 is improved as described above, the resistance of the channel of the first thin film transistor 1 and the second thin film transistor 2 may be significantly increased. Applying the sub-pixel structure 100 provided by the present disclosure to a liquid crystal display device can effectively avoid the problem that the liquid crystal display device has a large leakage current because of a reduction in the display frequency. Therefore, the liquid crystal display device can display at a lower display frequency, effectively reducing the power consumption, and because the leakage current is not easy to occur, it also effectively ensures that the liquid crystal display device has a better display effect.

In addition, because the first thin film transistor 1 and the second thin film transistor 2 are respectively close to the first side and the second side of the pixel electrode 3 opposite to each other, the first scanning line 210 and the second scanning line 220 are also respectively close to the first side and the second side of the pixel electrode 3 opposite to each other in the case where the first scanning line 210 and the second scanning line 220 are arranged to be connected to the first thin film transistor 1 and the second thin film transistor 2, respectively, so as to increase the distance between the two thin film transistors, which is beneficial to increasing the length of the channel region of each thin film transistor.

For example, in an embodiment of the present disclosure, the length direction of the channel region of the first thin film transistor 1 is the first direction and is substantially perpendicular to the scanning lines 200, and the length direction of the channel region of the second thin film transistor 2 is a second direction (for example, the Y direction) and is substantially parallel to the scanning lines 200.

For example, the first length threshold is 5% of the size of the pixel electrode 3 in the first direction, and the second length threshold is 5% of the size of the pixel electrode 3 in the second direction. For example, the length of the channel region of the first thin film transistor 1 is smaller than the size of the pixel electrode 3 in the first direction, and the length of the channel region of the second thin film transistor 2 is smaller than the size of the pixel electrode 3 in the second direction. For example, the length of the channel region of the first thin film transistor 1 may be 10% to 35% of the size of the pixel electrode 3 in the first direction, and the length of the channel region of the second thin film transistor 2 may be 10% to 35% of the size of the pixel electrode 3 in the second direction. For example, the length of the channel region of the first thin film transistor 1 may be 40% to 70% of the size of the pixel electrode 3 in the first direction, and the length of the channel region of the second thin film transistor 2 may be 40% to 70% of the size of the pixel electrode 3 in the second direction.

For example, as illustrated in FIG. 3, the drain electrode 13 of the first thin film transistor 1 is connected to the source electrode 22 of the second thin film transistor 2. The source electrode 12 of the first thin film transistor 1 and the gate electrode 11 of the first thin film transistor 1 are respectively connected to the data line 300 and the first scanning line 210 adjacent to the first thin film transistor 1. The drain electrode 23 of the second thin film transistor 2 and the gate electrode 21 of the second thin film transistor 2 are respectively connected to the pixel electrode 3 and the second scanning line 220 adjacent to the second thin film transistor 2.

For example, each scanning line 200 is used to output a scanning signal to a gate electrode of the corresponding thin film transistor to turn on and turn off the thin film transistor. The data signal output from the data line 300 is transmitted to the pixel electrode 3 sequentially through the source electrode 12 and the drain electrode 13 of the first thin film transistor 1, and the source electrode 22 and the drain electrode 23 of the second thin film transistor 2.

For example, the channel length of the first thin film transistor 1 may be equal to the channel length of the second thin film transistor 2, so as to reduce the charging difference between the first thin film transistor 1 and the second thin film transistor 2 during alternate operation.

For example, the scanning lines 200 connected to the sub-pixel structure 100 are parallel to each other, and the data line 300 is perpendicular to the scanning lines 200, that is, the data line 300 extends in the first direction and the scanning lines 200 extend in the second direction. Therefore, in the case where the first thin film transistor 1 and the second thin film transistor 2 adopt the above arrangement, the source electrode 12, the gate electrode 11, and the drain electrode 13 of the first thin film transistor 1, and the source electrode 2 and the gate electrode 21 of the second thin film transistor 2 are arranged in an L-shape, so that in the case where the channel length of the first thin film transistor 1 and the channel length of the second thin film transistor 2 are ensured to be as equal as possible, by extending the channel region of the first thin film transistor 1 and the channel region of the second thin film transistor 2 in different directions, the first thin film transistor 1 and the second thin film transistor 2 do not interfere with each other, and it is beneficial to increase the length of the channel region.

For example, the sub-pixel structure 100 may be disposed on a base substrate (not illustrated). FIG. 3 is a top view of the sub-pixel structure 100, the source electrode and the drain electrode of the thin film transistor are located above the gate electrode, that is, the source electrode and the drain electrode of the thin film transistor are located on a side of the gate electrode away from the base substrate. For example, in a direction perpendicular to the base substrate, the two thin film transistors included in each sub-pixel structure both overlap with the pixel electrode to improve the aperture ratio of the sub-pixel, and the pixel electrode is located on the side of the source electrode of the thin film transistor away from the scanning line. The pixel electrode in the embodiment of the present disclosure is made of a material with high reflectivity and can reflect light incident on the sub-pixel structure to the eyes of the user.

For example, as illustrated in FIG. 3, a region defined by a block 1a is the active region of the first thin film transistor 1, and a region defined by a block 2a is the active region of the second thin film transistor 2.

For example, in an embodiment of the present disclosure, the pixel electrode 3 includes a third side and a fourth side opposite to each other in the second direction. The first thin film transistor 1 is close to the third side of the pixel electrode 3 and is adjacent to the corresponding data line 300. The source electrode 22 of the second thin film transistor 2 is closer to the third side of the pixel electrode 3 than the drain electrode 23 of the second thin film transistor 2.

For example, as illustrated in FIG. 3, in the case where the first thin film transistor 1 is close to the third side of the pixel electrode 3, the first thin film transistor 1 is far away from the center of the pixel electrode 3.

Taking the case where the pixel electrode 3 is of a rectangular shape as an example, as illustrated in FIG. 3, the pixel electrode 3 includes a first edge 31, a second edge 32, a third edge 33, and a fourth edge 34. The first edge 31 is opposite to the second edge 32. The third edge 33 is opposite to the fourth edge 34. A side where the first edge 31 is located is the first side, a side where the second edge 32 is located is the second side, a side where the third edge 33 is located is the third side, and a side where the fourth edge 34 is located is the fourth side.

For example, both the first scanning line 210 and the second scanning line 220 overlap with the pixel electrode 3 in the direction perpendicular to the base substrate to increase the aperture ratio of each sub-pixel. The first scanning line 210 and the second scanning line 220 are respectively close to the first edge 31 and the second edge 32 of the pixel electrode 3, and the first edge 31 and the second edge 32 are both parallel to the scanning lines 200. The length direction of the channel region of the second thin film transistor 2 is parallel to the second edge 32, the gate electrode 21 of the second thin film transistor 2 is close to the second edge 32, and a part of the drain electrode 23 of the second thin film transistor 2 is close to the second edge 32.

For example, the data line 300 overlaps with the pixel electrode 3 in the direction perpendicular to the base substrate to increase the aperture ratio of each sub-pixel. The data line 300 is close to the position of the third edge 33 of the pixel electrode 3, and the third edge 33 is parallel to the data line 300. The length direction of the channel region of the first thin film transistor 1 is parallel to the third edge 33, the entirety of the first thin film transistor 1 is close to the third edge 33, and the source electrode 12 of the first thin film transistor 1 is close to the first edge 31.

It should be noted that the pixel electrode 3 may be of other shapes. For the pixel electrode 3 with other shape, two sides of the pixel electrode 3 that are close to the two scanning lines 200 are taken as the first side and the second side, respectively; and a side of the pixel electrode 3 that is close to the data line 300 is taken as the third side.

For example, as illustrated in FIG. 3, the gate electrode 11 of the first thin film transistor 1 and the drain electrode 23 of the second thin film transistor 2 are located on the same side of the gate electrode 21 of the second thin film transistor 2. That is, the gate electrode 21 of the second thin film transistor 2 is close to the second side of the pixel electrode 3, and the first thin film transistor 1 and the drain electrode 23 of the second thin film transistor 2 are both located a side of the gate electrode 21 of the second thin film transistor away from the second side of the pixel electrode 3, so that the distance between the gate electrode of the first thin film transistor and the gate electrode of the second thin film transistor can be increased, which is beneficial to increase the channel length of each thin film transistor.

For example, as illustrated in FIG. 3, the source electrode 22 and the drain electrode 23 of the second thin film transistor 2 are located on the same side of the gate electrode 21 of the second thin film transistor 2, which is beneficial to increase the channel length of the second thin film transistor.

For example, as illustrated in FIG. 3, the gate electrode 11 of the first thin film transistor 1 and the drain electrode 23 of the second thin film transistor 2 are located on two sides of the center line, extending in the first direction, of the gate electrode 32 of the second thin film transistor 2, which is beneficial to increase the channel length of the second thin film transistor.

For example, as illustrated in FIG. 3, the gate electrode 21 and the drain electrode 23 of the second thin film transistor 2 are located on one side of the center line, extending in the first direction, of the gate electrode 11 of the first thin film transistor 1, which is beneficial to increase the channel length of the first thin film transistor.

For example, as illustrated in FIG. 3, the source electrode 12 of the first thin film transistor 1 and the gate electrode 21 of the second thin film transistor 2 are located on two sides of the center line, extending in the second direction, of the drain electrode 23 of the second thin film transistor 2.

For example, in an embodiment of the present disclosure, the source electrode 12 and the drain electrode 13 of the first thin film transistor 1, and the source electrode 22 and the drain electrode 23 of the second thin film transistor 2 are located on the same layer as the data line 300. The gate electrode 11 of the first thin film transistor 1 and the gate electrode 21 of the second thin film transistor 2 are located on the same layer as the scanning lines 200.

In the embodiments of the present disclosure, the scanning lines 200, the data line 300, and the first thin film transistor 1 and the second thin film transistor 2 of the sub-pixel structure 100 are all integrated on the array substrate. In the process for manufacturing the scanning lines 200, the data line 300, and the sub-pixel structure 100, the source electrode 12 and the drain electrode 13 of the first thin film transistor 1, the source electrode 22 and the drain electrode 23 of the second thin film transistor 2, and the data line 300 may be completed in the same mask process (MASK); and the gate electrode 11 of the first thin film transistor 1, the gate electrode 21 of the second thin film transistor 2, and the scanning lines 200 may be completed in the same mask process. Therefore, the sub-pixel structure 100 provided by the present disclosure may simplify the manufacturing process and improve the manufacturing efficiency. The MASK refers to a sub-process in the manufacturing process, and the sub-process may include a photolithography process.

For example, the sub-pixel structure 100 includes a first conductive strip 4, a second conductive strip 5, and a conductive block 6. One end of the first conductive strip 4 is used as the source electrode 12 of the first thin film transistor 1, and the other end of the first conductive strip 4 is connected to the data line 300. One end of the second conductive strip 5 is used as the drain electrode 13 of the first thin film transistor 1, and the other end of the second conductive strip 5 is used as the source electrode 22 of the second thin film transistor 2. The conductive block 6 is between the two scanning lines which are adjacent to each other (the first scanning line 210 and the second scanning line 220), a part of the conductive block 6 is used as the drain electrode 23 of the second thin film transistor 2, and the other part of the conductive block 6 is connected to the pixel electrode 3.

The data signal output from the data line 300 is transmitted to the pixel electrode 3 sequentially through the first conductive strip 4, the channel region of the first thin film transistor 1, the second conductive strip 5, the channel region of the second thin film transistor 2, and the conductive block 6.

For example, at least one via 7 is provided between the conductive block 6 and the pixel electrode 3, and the conductive block 6 is connected to the pixel electrode 3 through the at least one via 7. FIG. 3 schematically illustrates the number of the at least one via 7 is two, the present disclosure is not limited thereto, the number of the at least one via 7 can also be one or more than two.

For example, in an embodiment of the present disclosure, the gate electrode 11 of the first thin film transistor 1 has a strip shape, and the shape of the gate electrode 11 is a strip and extends in the direction perpendicular to the scanning lines 200.

For example, one end of the gate electrode 11 of the first thin film transistor 1 forms an integrated structure with the first scanning line 210 adjacent to the first thin film transistor 1, and overlaps with the end, used as the source electrode 12, of the first conductive strip 4. The other end of the gate electrode 11 of the first thin film transistor 1 overlaps with the end, used as the drain electrode 13, of the second conductive strip 5.

For example, the gate electrode 11 of the first thin film transistor 1 can be taken as a strip-shaped member formed integrally with the first scanning line 210. One end of the strip-shaped member intersects with the first scanning line 210, and the strip-shaped member is perpendicular to the first scanning line 210.

For example, in an embodiment of the present disclosure, the gate electrode 21 of the second thin film transistor 2 has a strip shape, and the shape of the gate electrode 21 is a strip and extends in the direction parallel to the scanning lines 200. The gate electrode 21 of the second thin film transistor 2 forms an integrated structure with the second scanning line 220 adjacent to the second thin film transistor 2. One end of the gate electrode 21 of the second thin film transistor 2 overlaps with the end, used as the source electrode 22, of the second conductive strip 5, and the other end of the gate electrode 21 of the second thin film transistor 2 overlaps with a part, used as the drain electrode 23, of the conductive block 6.

For example, the gate electrode 2 of the second thin film transistor 2 can be taken as a part of the second scanning line 220. A portion, between the source electrode 22 and the drain electrode 23 of the second thin film transistor 2, of the second scanning line 220 is used as the gate electrode 2 of the second thin film transistor 2.

In an embodiment of the present disclosure, the length of the channel region between the source electrode 12 and the drain electrode 13 of the first thin film transistor 1 is L1, and the length of the channel region between the source electrode 22 and the drain electrode 23 of the second thin film transistor 2 is L2. The value range of L1 and L2 can be determined according to the size of the sub-pixel, and the values of L1 and L2 generally do not exceed the width of the sub-pixel.

Figure 4:
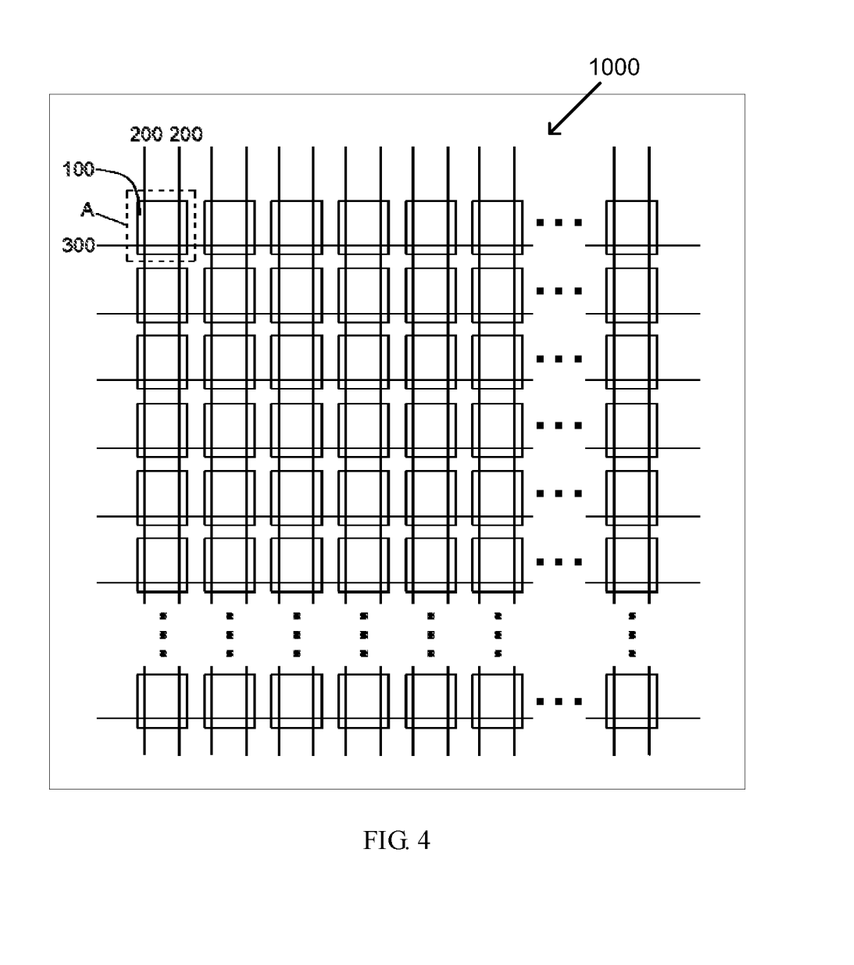
FIG. 4 is a schematic structural diagram of a part of a liquid crystal panel provided by an embodiment of the present disclosure.

Based on the same inventive concept, an embodiment of the present disclosure further provides a liquid crystal panel, and the structure of the liquid crystal panel is illustrated in FIG. 3 and FIG. 4. It should be noted that FIG. 3 can be taken as an enlarged view at A in FIG. 4. The liquid crystal panel includes an array substrate 1000, and the array substrate 1000 includes a plurality of rows of scanning lines 200 parallel to each other, a plurality of columns of data lines 300 parallel to each other, and a plurality of the sub-pixel structures 100 provided by the above mentioned embodiments of the present disclosure.

For example, as illustrated in FIG. 3 and FIG. 4, the scanning lines 200, the data lines 300, and first thin film transistors 1 and second thin film transistors 2 of the sub-pixel structures 100 are all integrated on the array substrate 1000, and the data lines 300 are perpendicular to the scanning lines 200. For example, the data lines 300 extend in the first direction, and the scanning lines 200 extend in the second direction.

For example, the gate electrode 11 of the first thin film transistor 1 and the gate electrode 21 of the second thin film transistor 2 are respectively close to the first side and the second side of the pixel electrode 3 opposite to each other in the first direction, and are respectively adjacent to and connected to the first scanning line 210 and the second scanning line 220 in the array substrate 1000. The data lines 300, the first scanning line 210, and the second scanning line 220 all overlap with the pixel electrode 3 of each sub-pixel 100, and the first scanning line 210 and the second scanning line 220 are respectively close to the first side and the second side, opposite to each other, of the pixel electrode 3. The length of the channel region of the first thin film transistor 1 is greater than the first length threshold, and the length of the channel region of the second thin film transistor 2 is greater than the second length threshold.

For example, the first length threshold is 5% of the size of the pixel electrode 3 in the first direction, and the second length threshold is 5% of the size of the pixel electrode 3 in the second direction. For example, the length of the channel region of the first thin film transistor 1 is smaller than the size of the pixel electrode 3 in the first direction, and the length of the channel region of the second thin film transistor 2 is smaller than the size of the pixel electrode 3 in the second direction. For example, the length of the channel region of the first thin film transistor 1 may be 10% to 35% of the size of the pixel electrode 3 in the first direction, and the length of the channel region of the second thin film transistor 2 may be 10% to 35% of the size of the pixel electrode 3 in the second direction.

For example, two sides, close to the two scanning lines 200, of the pixel electrode 3 are taken as the first side and the second side, respectively; and one side, close to the data line 300, of the pixel electrode 3 is taken as the third side.

For example, the first thin film transistor 1 is close to the third side of the pixel electrode 3 in the second direction, and the data line 300 is located at a side of the first thin film transistors 1 and the second thin film transistor 2 close to the third side of the pixel electrode 3. The gate electrode 11 and the drain electrode 13 of the first thin film transistor 1 are between the drain electrode 23 of the second thin film transistor 2 and the data line 300 in the second direction.

For example, in an embodiment of the present disclosure, the length direction of the channel region of the first thin film transistor 1 is the first direction and is substantially perpendicular to the scanning lines 200, and the length direction of the channel region of the second thin film transistor 2 is the second direction (for example, the Y direction) and is substantially parallel to the scanning lines 200.

For example, the source electrode 12 of the first thin film transistor 1 and the gate electrode 11 of the first thin film transistor 1 are respectively connected to the data line 300 and the first scanning line 210 adjacent to the first thin film transistor 1. The drain electrode 23 of the second thin film transistor 2 and the gate electrode 21 of the second thin film transistor 2 are respectively connected to the pixel electrode 3 and the second scanning line 220 adjacent to the second thin film transistor 2.

For example, each scanning line 200 is used to output a scanning signal to a gate electrode of the corresponding thin film transistor to turn on and turn off the thin film transistor. The data signal output from the data line 300 is transmitted to the pixel electrode 3 sequentially through the source electrode 12 and the drain electrode 13 of the first thin film transistor 1, and the source electrode 22 and the drain electrode 23 of the second thin film transistor 2.

For example, in an embodiment of the present disclosure, the gate electrode 11 of the first thin film transistor 1 and the first scanning line 210 are located on the same layer. The gate electrode 11 of the first thin film transistor 1 has a strip shape, and the shape of the gate electrode 11 is a strip and extends in the direction perpendicular to the scanning lines 200. One end of the gate electrode 11 of the first thin film transistor 1 forms an integrated structure with the first scanning line 210 adjacent to the first thin film transistor 1.

For example, in an embodiment of the present disclosure, the gate electrode 21 of the second thin film transistor 2 and the second scanning line 220 are located on the same layer, and the shape of the gate electrode 21 is a strip and extends in the direction parallel to the scanning lines 200. The gate electrode 21 of the second thin film transistor 2 forms an integrated structure with the second scanning line 220 adjacent to the second thin film transistor 2.

For example, the source electrode 12 and the drain electrode 13 of the first thin film transistor 1, and the source electrode 22 and the drain electrode 23 of the second thin film transistor 2 are located on the same layer as the data line 300.

For example, the sub-pixel structure 100 includes a first conductive strip 4, a second conductive strip 5, and a conductive block 6. One end of the first conductive strip 4 is used as the source electrode 12 of the first thin film transistor 1, and the other end of the first conductive strip 4 is connected to the data line 300. One end of the second conductive strip 5 is used as the drain electrode 13 of the first thin film transistor 1, and the other end of the second conductive strip 5 is used as the source electrode 22 of the second thin film transistor 2. The conductive block 6 is between the two scanning lines which are adjacent to each other (the first scanning line 210 and the second scanning line 220), a part of the conductive block 6 is used as the drain electrode 23 of the second thin film transistor 2, and the other part of the conductive block 6 is connected to the pixel electrode 3.

The data signal output from the data line 300 is transmitted to the pixel electrode 3 sequentially through the first conductive strip 4, the channel region of the first thin film transistor 1, the second conductive strip 5, the channel region of the second thin film transistor 2, and the conductive block 6.

For example, one end of the gate electrode 11 of the first thin film transistor 1 overlaps with the end, used as the source electrode 12 of the first thin film transistor 1, of the first conductive strip 4. The other end of the gate electrode 11 of the first thin film transistor 1 overlaps with the end, used as the drain electrode 13 of the first thin film transistor 1, of the second conductive strip 5. One end of the gate electrode 21 of the second thin film transistor 2 overlaps with the end, used as the source electrode 22 of the second thin film transistor 2, of the second conductive strip 5, and the other end of the gate electrode 21 of the second thin film transistor 2 overlaps with a part, used as the drain electrode 23 of the second thin film transistor 2, of the conductive block 6.

The relative positional relationship between the first thin film transistor and the second thin film transistor in each sub-pixel in the display panel provided by the embodiment of the present disclosure is the same as the relative positional relationship between the first thin film transistor and the second thin film transistor in the sub-pixel in the embodiment illustrated in FIG. 3, and details are not described herein again.

For example, the liquid crystal panel provided by the embodiments of the present disclosure further includes a common electrode and a liquid crystal layer between the common electrode and the pixel electrode, and the common electrode is made of a transparent conductive material. External ambient light passes through the common electrode and the liquid crystal layer and then enters the pixel electrode, and the pixel electrode reflects the ambient light to the user's eyes to achieve a reflective display.

The display panel provided by the embodiment of the present disclosure has the same inventive concept and the same beneficial effects as the previous embodiments. For the content not described in detail in the display panel, reference may be made to the previous embodiments, and details are not described herein again.

Based on the same inventive concept, an embodiment of the present disclosure further provides a reflective liquid crystal display device, including the liquid crystal panel provided by the foregoing embodiments of the present disclosure.

The reflective liquid crystal display device provided by the embodiment of the present disclosure has the same inventive concept and the same beneficial effects as the previous embodiments. For the content not described in detail in the reflective liquid crystal display device, reference may be made to the previous embodiments, and details are not described herein again.

By applying the embodiments of the present disclosure, at least the following beneficial effects can be achieved.

In the sub-pixel structure provided by the present disclosure, because the first thin film transistor and the second thin film transistor are respectively close to the first side and the second side, opposite to each other, of the pixel electrode, the separation between the two thin film transistors is increased, so that each thin film transistor has a larger layout space. The length of the channel region of the first thin film transistor may be appropriately extended to exceed the first length threshold; and the length of the channel region of the second thin film transistor may be appropriately extended to exceed the second length threshold. After the sub-pixel structure is improved as described above, the resistance of the channel of the first thin film transistor and the resistance of the channel of the second thin film transistor may be significantly increased. Applying the sub-pixel structure provided by the present disclosure to a liquid crystal display device can effectively avoid the problem that the liquid crystal display device has a large leakage current because of a reduction in the display frequency. Therefore, the liquid crystal display can display at a lower display frequency, effectively reducing the power consumption, and because the leakage current is not easy to occur, it also effectively ensures that the liquid crystal display device has a better display effect.

In addition, because the first thin film transistor and the second thin film transistor are respectively close to the first side and the second side, opposite to each other, of the pixel electrode, the two scanning lines are also respectively close to the first side and the second side, opposite to each other, of the pixel electrode in the case where the two scanning lines are arranged to be connected to the first thin film transistor and the second thin film transistor, so as to increase the distance between gate electrodes of the two thin film transistors, which is beneficial to increasing the length of the channel region of each thin film transistor.

In the process for manufacturing the scanning lines, the data line, and the sub-pixel structure, the source electrode and the drain electrode of the first thin film transistor, the source electrode and the drain electrode of the second thin film transistor, and the data line may be completed in the same mask process; and the gate electrode of the first thin film transistor, the gate electrode of the second thin film transistor, and the scanning lines may be completed in the same mask process. In this way, the manufacturing process can be simplified, and the manufacturing efficiency can be improved.

The following statements should be noted:

(1) Unless otherwise defined, in the embodiments and the accompanying drawings of the present disclosure, the same reference numerals represent the same meaning.

(2) The accompanying drawings involve only the structure(s) in connection with the embodiment(s) of the present disclosure, and other structure(s) can be referred to common design(s).

(3) In order to clearly illustrate, a layer or an area may be amplified in the accompanying drawings of the embodiments of the present disclosure. It is to be understood that, in the case where a member such as a layer, a film, an area or a substrate is located or disposed on or below another member, the member can be located or disposed on or below the another member directly, or an intermediate member or intermediate member(s) can be disposed.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A sub-pixel structure, comprising a pixel electrode, and a first thin film transistor and a second thin film transistor integrated on an array substrate,
   wherein the first thin film transistor and the second thin film transistor are respectively close to a first side and a second side, opposite to each other, of the pixel electrode, and are adjacent to and are connected to two scanning lines in the array substrate, respectively; and
   a length of a channel region of the first thin film transistor is greater than a first length threshold, and a length of a channel region of the second thin film transistor is greater than a second length threshold;
   a length direction of the channel region of the first thin film transistor is substantially perpendicular to the two scanning lines, a length direction of the channel region of the second thin film transistor is substantially parallel to the two scanning lines, and the two scanning lines are parallel to each other;
   a drain electrode of the first thin film transistor is connected to a source electrode of the second thin film transistor, a source electrode of the first thin film transistor is connected to a corresponding data line, a gate electrode of the first thin film transistor is connected to one of the two scanning lines which is adjacent to the first thin film transistor, and the data line is perpendicular to the scanning line adjacent to the first thin film transistor; and
   a drain electrode of the second thin film transistor is connected to the pixel electrode, and a gate electrode of the second thin film transistor is connected to one of the two scanning lines which is adjacent to the second thin film transistor.

2. The sub-pixel structure according to claim 1, wherein the first thin film transistor is close to a third side of the pixel electrode in a direction parallel to the two scanning lines and is adjacent to the data line; and the source electrode of the second thin film transistor is closer to the third side of the pixel electrode than the drain electrode of the second thin film transistor.

3. The sub-pixel structure according to claim 2, wherein the source electrode and the drain electrode of the first thin film transistor, the source electrode and the drain electrode of the second thin film transistor are located on the same layer as the data line; the gate electrode of the first thin film transistor and the gate electrode of the second thin film transistor are located on the same layer as the two scanning lines;
   the sub-pixel structure comprises a first conductive strip, a second conductive strip, and a conductive block; one end of the first conductive strip is used as the source electrode of the first thin film transistor, and the other end of the first conductive strip is connected to the data line; one end of the second conductive strip is used as the drain electrode of the first thin film transistor, and the other end of the second conductive strip is used as the source electrode of the second thin film transistor; and the conductive block is located between the two scanning lines which are adjacent to each other, a part of the conductive block is used as the drain electrode of the second thin film transistor, and the other part of the conductive block is connected to the pixel electrode.

4. The sub-pixel structure according to claim 3, wherein the gate electrode of the first thin film transistor has a strip shape and extends in a direction perpendicular to the two scanning lines;
   one end of the gate electrode of the first thin film transistor is configured to form an integrated structure with one of the two scanning lines which is adjacent to the first thin film transistor, and overlaps with the end, used as the source electrode of the first thin film transistor, of the first conductive strip; and the other end of the gate electrode of the first thin film transistor overlaps with the end, used as the drain electrode of the first thin film transistor, of the second conductive strip.

5. The sub-pixel structure according to claim 3, wherein the gate electrode of the second thin film transistor has a strip shape and extends in the direction parallel to the two scanning lines, and is configured to form an integrated structure with one of the two scanning lines which is adjacent to the second thin film transistor; and
   one end of the gate electrode of the second thin film transistor overlaps with the end, used as the source electrode of the second thin film transistor, of the second conductive strip, and the other end of the gate electrode of the second thin film transistor overlaps with the conductive block.

6. A liquid crystal panel, comprising an array substrate, a plurality of rows of scanning lines parallel to each other, a plurality of columns of data lines parallel to each other, and a plurality of sub-pixel structures each of which is the sub-pixel structure according to claim 1,
wherein the scanning lines, the data lines, and the first thin film transistors and the second thin film transistors of the sub-pixel structures are all integrated on the array substrate; the data lines are perpendicular to the scanning lines;
the first thin film transistor and the second thin film transistor of each of the sub-pixel structures are adjacent to and connected to the two scanning lines of the scanning lines, respectively, and the first thin film transistor of each of the sub-pixel structures is further connected to one of the data lines.

7. The liquid crystal panel according to claim 6, wherein a source electrode of the first thin film transistor in each sub-pixel structure is connected to a corresponding data line, and a gate electrode of the first thin film transistor in each sub-pixel structure is connected to one scanning line of the two scanning lines which is adjacent to the first thin film transistor; and
a drain electrode of the second thin film transistor in each sub-pixel structure is connected to the pixel electrode of the sub-pixel structure, and a gate electrode of the second thin film transistor in each sub-pixel structure is connected to one scanning line of the two scanning lines which is adjacent to the second thin film transistor.

8. The liquid crystal panel according to claim 7, wherein one end of the gate electrode of the first thin film transistor and the scanning line adjacent to the first thin film transistor are in an integrated structure, and the gate electrode of the second thin film transistor and the scanning line adjacent to the second thin film transistor are in an integrated structure.

9. A reflective liquid crystal display device, comprising the liquid crystal panel according to claim 6.

10. A sub-pixel structure, comprising a pixel electrode, a first thin film transistor, and a second thin film transistor,
wherein the first thin film transistor and the second thin film transistor both overlap with the pixel electrode,
a gate electrode of the first thin film transistor and a gate electrode of the second thin film transistor are respectively close to a first side and a second side, opposite to each other, of the pixel electrode, the gate electrode of the first thin film transistor is connected to a first scanning line, and the gate electrode of the second thin film transistor is connected to a second scanning line;
a length of a channel region of the first thin film transistor is greater than a first length threshold, a length of a channel region of the second thin film transistor is greater than a second length threshold, the first length threshold is 5% of a size of the pixel electrode in a length direction of the channel region of the first thin film transistor, and the second length threshold is 5% of a size of the pixel electrode in a length direction of the channel region of the second thin film transistor.

11. The sub-pixel structure according to claim 10, wherein the length direction of the channel region of the first thin film transistor is a first direction, and the length direction of the channel region of the second thin film transistor is a second direction;
a drain electrode of the first thin film transistor is connected to a source electrode of the second thin film transistor, a source electrode of the first thin film transistor is connected to a data line, and a drain electrode of the second thin film transistor is connected to the pixel electrode; and
the data line is configured to extend in the first direction, the first scanning line and the second scanning line are configured to extend in the second direction, and the first direction is perpendicular to the second direction.

12. The sub-pixel structure according to claim 11, wherein the source electrode, the gate electrode and the drain electrode of the first thin film transistor, and the source electrode and the gate electrode of the second thin film transistor are arranged in an L-shape.

13. The sub-pixel structure according to claim 11, wherein the gate electrode of the first thin film transistor and the drain electrode of the second thin film transistor are located on a same side of the gate electrode of the second thin film transistor.

14. The sub-pixel structure according to claim 11, wherein the source electrode and the drain electrode of the second thin film transistor are located on a same side of the gate electrode of the second thin film transistor.

15. The sub-pixel structure according to claim 11, wherein the gate electrode and the drain electrode of the second thin film transistor are located on a same side of a center line, extending in the first direction, of the gate electrode of the first thin film transistor.

16. The sub-pixel structure according to claim 11, wherein the source electrode of the first thin film transistor and the gate electrode of the second thin film transistor are located on two sides of a center line, extending in the second direction, of the drain electrode of the second thin film transistor.

17. A liquid crystal panel, comprising an array substrate, wherein the array substrate comprises a first scanning line and a second scanning line parallel to each other, a data line, and the sub-pixel structure according to claim 10;
the data line extends in a first direction, the first scanning line and the second scanning line extend in a second direction, and the first direction is perpendicular to the second direction;
the first thin film transistor and the second thin film transistor of the sub-pixel structure are adjacent to and connected to the first scanning line and the second scanning line, respectively; the first thin film transistor is connected to the data line; and
the data line, the first scanning line, and the second scanning line all overlap with the pixel electrode, and the first scanning line and the second scanning line are respectively close to the first side and the second side, opposite to each other, of the pixel electrode.

18. The liquid crystal panel according to claim 17, wherein the first thin film transistor is close to a third side of the pixel electrode in the second direction, the data line is located at a side of the first thin film transistor and the second thin film transistor close to the third side of the pixel electrode, and in the second direction, the gate electrode of the first thin film transistor and a drain electrode of the first thin film transistor are between a drain electrode of the second thin film transistor and the data line.

* * * * *